(12) United States Patent
Kim

(10) Patent No.: US 11,728,261 B2
(45) Date of Patent: Aug. 15, 2023

(54) CHIP ON FILM PACKAGE AND DISPLAY APPARATUS INCLUDING THE SAME

(71) Applicant: SAMSUNG ELECTRONICS CO., LTD., Suwon-si (KR)

(72) Inventor: Duckgyu Kim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 85 days.

(21) Appl. No.: 17/314,567

(22) Filed: May 7, 2021

(65) Prior Publication Data
US 2022/0028777 A1    Jan. 27, 2022

(30) Foreign Application Priority Data

Jul. 23, 2020 (KR) .......................... 10-2020-0091751

(51) Int. Cl.
| | |
|---|---|
| H01L 23/498 | (2006.01) |
| H01L 23/31 | (2006.01) |
| H01L 23/367 | (2006.01) |
| H01L 21/48 | (2006.01) |
| H01L 21/56 | (2006.01) |
| H01L 23/00 | (2006.01) |

(52) U.S. Cl.
CPC .... *H01L 23/49838* (2013.01); *H01L 21/4853* (2013.01); *H01L 21/4871* (2013.01); *H01L 21/563* (2013.01); *H01L 23/3185* (2013.01); *H01L 23/3672* (2013.01); *H01L 23/4985* (2013.01); *H01L 24/16* (2013.01); *H01L 2224/16227* (2013.01); *H01L 2924/18161* (2013.01)

(58) Field of Classification Search
CPC ................................................. H01L 23/49838
See application file for complete search history.

(56) References Cited

U.S. PATENT DOCUMENTS

| | | | | |
|---|---|---|---|---|
| 6,097,602 | A * | 8/2000 | Witchger | ............ H01L 23/4275 361/705 |
| 7,649,246 | B2 | 1/2010 | Chung et al. | |
| 2006/0208365 | A1 | 9/2006 | Shen et al. | |
| 2006/0209514 | A1 * | 9/2006 | Katoh | ..................... H01L 23/36 257/E23.101 |

FOREIGN PATENT DOCUMENTS

| | | |
|---|---|---|
| CN | 101231989 B | 6/2010 |
| CN | 209000903 U | 6/2019 |
| JP | 2002-050660 A | 2/2002 |
| KR | 1998-058603 A | 10/1998 |
| KR | 10-0618898 B1 | 9/2006 |
| KR | 10-1493869 B1 | 2/2015 |

\* cited by examiner

*Primary Examiner* — William A Harriston
(74) *Attorney, Agent, or Firm* — Lee IP Law, P.C.

(57) ABSTRACT

A chip-on-film (CoF) package and a display apparatus, the package including a base film having an upper surface and a lower surface facing each other; a conductive line on the upper surface of the base film; a semiconductor chip on the upper surface of the base film and connected to the conductive line through a bump structure; a heat radiator on the lower surface of the base film and underlying the semiconductor chip; an adhesive layer between the lower surface of the base film and the heat radiator; and a plurality of dam structures in the adhesive layer and overlapping the bump structure.

20 Claims, 15 Drawing Sheets

CHIP ON FILM PACKAGE AND DISPLAY APPARATUS INCLUDING THE SAME

CROSS-REFERENCE TO RELATED APPLICATION

Korean Patent Application No. 10-2020-0091751, filed on Jul. 23, 2020, in the Korean Intellectual Property Office, and entitled: "Chip on Film Package and Display Apparatus Including the Same," is incorporated by reference herein in its entirety.

BACKGROUND

1. Field

Embodiments relate to a chip-on-film (CoF) package and a display apparatus including the same.

2. Description of the Related Art

In the CoF package, a semiconductor chip may be mounted on a base film, and the mounted semiconductor chip may be electrically connected to an external apparatus through a conductive line on the base film.

SUMMARY

The embodiments may be realized by providing a chip-on-film (CoF) package including a base film having an upper surface and a lower surface facing each other; a conductive line on the upper surface of the base film; a semiconductor chip on the upper surface of the base film and connected to the conductive line through a bump structure; a heat radiator on the lower surface of the base film and underlying the semiconductor chip; an adhesive layer between the lower surface of the base film and the heat radiator; and a plurality of dam structures in the adhesive layer and overlapping the bump structure.

The embodiments may be realized by providing a chip-on-film (CoF) package including a base film having an upper surface and a lower surface facing each other, the base film including a chip mounting area on the upper surface thereof; a conductive line on the upper surface of the base film and having a conductive pad at an end thereof; a semiconductor chip on the chip mounting area and having long sides extending in a first direction and short sides extending in a second direction perpendicular to the first direction; a protection layer on the conductive line and the upper surface of the base film to expose the conductive pad; a bump structure between the conductive pad and a bump pad of the semiconductor chip; an underfill filled the semiconductor chip and the base film and surrounding the bump structure; a heat radiator on the lower surface of the base film and underlying the chip mounting area; an adhesive layer between the lower surface of the base film and the heat radiator; two dam structures in the adhesive layer and respectively underlying the short sides of the semiconductor chip; and a cover film coupled onto a lower surface of the heat radiator.

The embodiments may be realized by providing a display apparatus including a chip-on-film (CoF) package including a base film having an upper surface and a lower surface facing each other; a display panel arranged to face a portion of the upper surface of the base film; and a driving printed circuit board arranged to face the other portion of the upper surface of the base film, wherein the CoF package includes a conductive line on the upper surface of the base film; a semiconductor chip on the upper surface of the base film and connected to the conductive line through a bump structure; a heat radiator on the lower surface of the base film and underlying the semiconductor chip; and a plurality of dam structures between the lower surface of the base film and the heat radiator and overlapping the bump structure.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
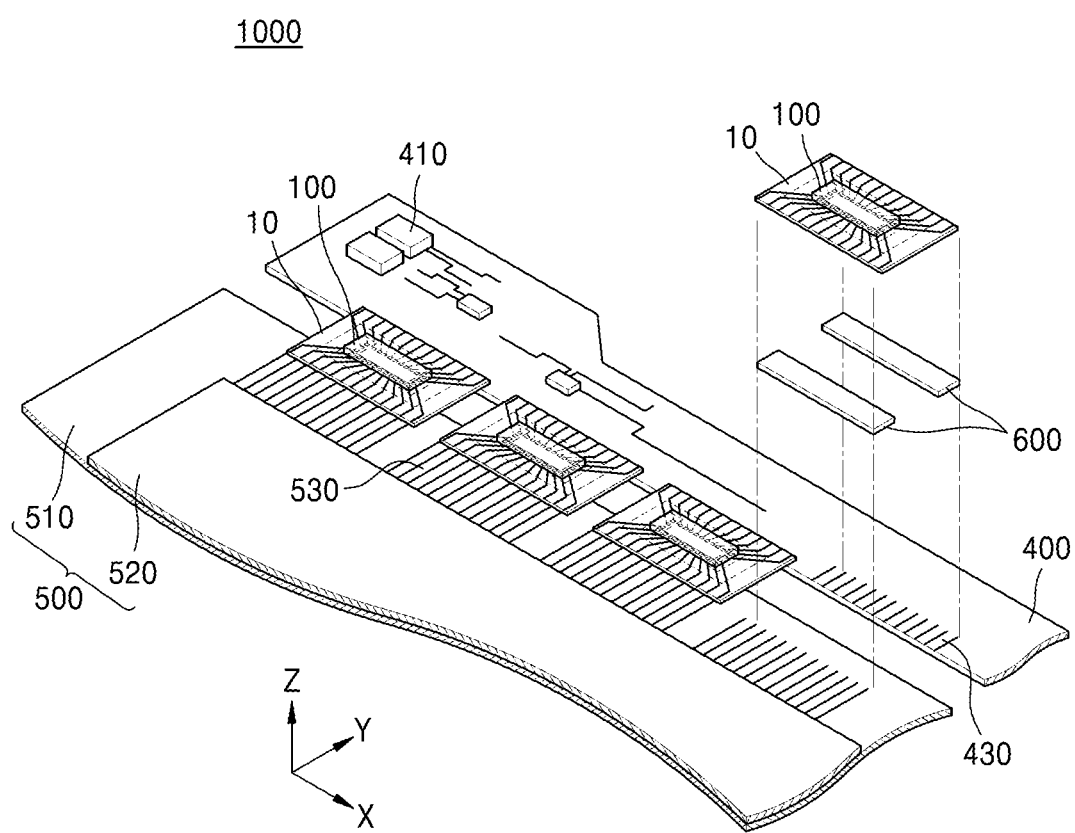
FIG. 1 is a perspective view of a display apparatus according to an embodiment.

FIG. 1 is a perspective view of a display apparatus 1000 according to an embodiment.

Referring to FIG. 1, the display apparatus 1000 may include at least one chip-on-film (CoF) package 10, a driving printed circuit board 400, and a display panel 500.

The CoF package 10 may include a package including a semiconductor chip 100 corresponding to a display driver integrated circuit (IC) (DDI). In an implementation, one semiconductor chip 100 may be arranged in one CoF package 10. In an implementation, different types of semiconductor chips 100 may be arranged in one CoF package 10. In an implementation, the semiconductor chips 100 may include a source DDI or a gate DDI. As used herein, the term "or" is not an exclusive term, e.g., "A or B" would include A, B, or A and B.

The CoF package 10 may be between the driving printed circuit board 400 and the display panel 500 and connected to each of the driving printed circuit board 400 and the display panel 500. The CoF package 10 may receive a signal that is output from the driving printed circuit board 400 and transmit the signal to the display panel 500.

One or more driving circuit chips 410 configured to simultaneously or sequentially apply power and signals to the CoF package 10 may be mounted on the driving printed circuit board 400.

The display panel 500 may include, e.g., a liquid crystal display (LCD) panel, light-emitting diode (LED) panel, an organic LED panel, a plasma display panel (PDP), or the like.

The CoF package 10 may be electrically connected to driving connection lines 430 of the driving printed circuit board 400 and panel connection lines 530 of the display panel 500.

In an implementation, one CoF package 10 may be connected between the driving printed circuit board 400 and the display panel 500. In an implementation, when the display panel 500 is configured to provide a screen having a small area, such as a cellular phone, or support relatively low resolution, the display apparatus 1000 may include one CoF package 10.

In an implementation, a plurality of CoF packages 10 may be connected between the driving printed circuit board 400 and the display panel 500. In an implementation, when the display panel 500 is configured to provide a screen having a large area, such as a television, or support relatively high resolution, the display apparatus 1000 may include the plurality of CoF packages 10.

In an implementation, CoF package 10 may be connected to only one lateral side of the display panel 500. In an implementation, the CoF package 10 in a singular number or a plural number may be connected to each of two or more lateral sides of the display panel 500.

The display panel 500 may include a transparent substrate 510, an image area 520 on the transparent substrate 510, and the panel connection lines 530. The transparent substrate 510 may include, e.g., a glass substrate or a flexible substrate. A plurality of pixels included in the image area 520 may be connected to the plurality of panel connection lines 530 corresponding to the plurality of pixels, respectively, and may operate in response to a signal provided by the semiconductor chip 100 mounted in the CoF package 10.

An input pad may be on an end of the CoF package 10, and an output pad may be on the other end of the CoF package 10. The input pad and the output pad may be connected to the driving connection lines 430 of the driving printed circuit board 400 and the panel connection lines 530 of the display panel 500, respectively, through an anisotropic conductive layer 600.

The anisotropic conductive layer 600 may include, e.g., an anisotropic conductive film or an anisotropic conductive paste. The anisotropic conductive layer 600 may have a structure in which conductive particles are distributed in an insulating adhesive layer. In an implementation, the anisotropic conductive layer 600 may have anisotropic electrical characteristics in which the anisotropic conductive layer 600 may be short-circuited or connected only in an electrode direction (a vertical or Z direction) when the anisotropic conductive layer 600 is connected, and may be insulated in a direction (an X direction) between adjacent electrodes. When an adhesive is fused onto the anisotropic conductive layer 600 by applying heat and pressure to the anisotropic conductive layer 600, conductive particles may be between facing electrodes, e.g., between the input pad and the driving connection lines 430 and between the output pad and the panel connection lines 530, and thus, the anisotropic conductive layer 600 may have a conductive property. In an implementation, the adhesive may be filled between adjacent electrodes to insulate the adjacent electrodes.

Hereinafter, the CoF package 10 included in the display apparatus 1000 according to an embodiment will be described in detail.

FIGS. 2 through 5 are views of the CoF package 10 according to an embodiment.

Figure 2:
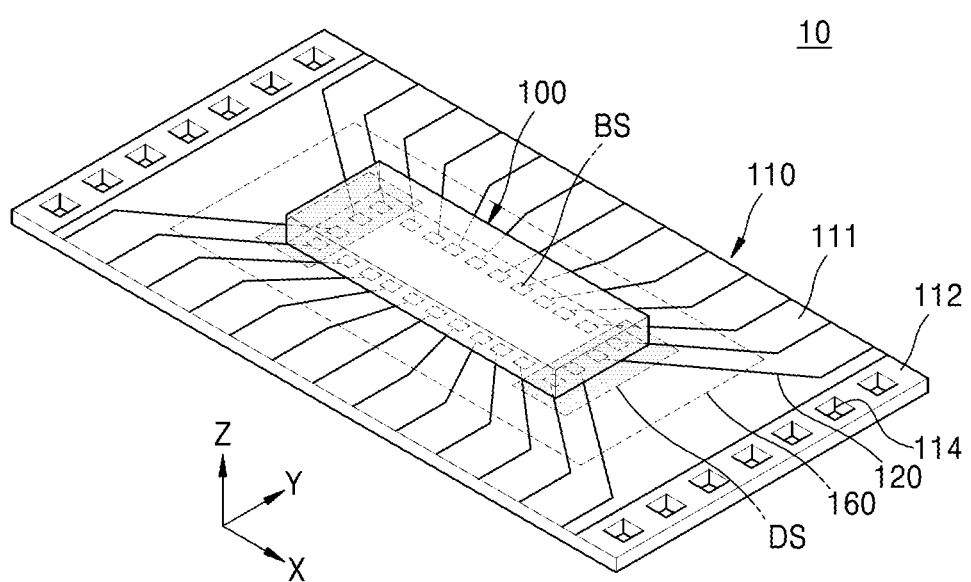
FIG. 2 is a perspective view of a chip-on-film (CoF) package according to an embodiment.
Figure 3:
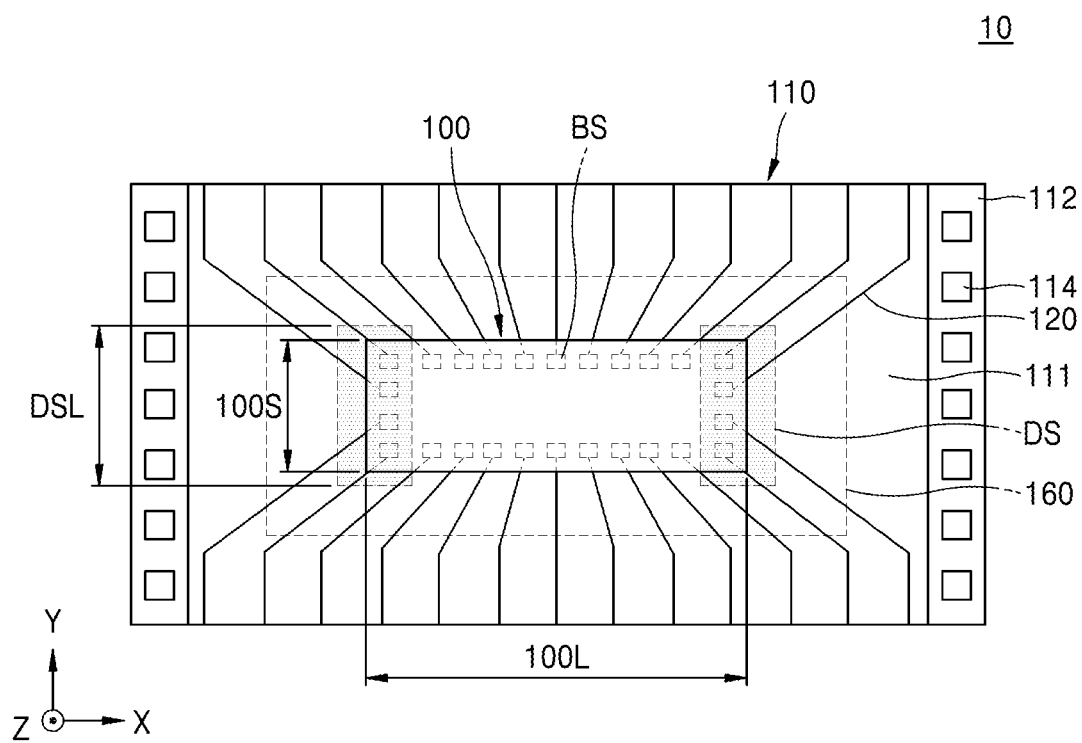
FIG. 3 is a plan view of the CoF package of FIG. 2.
Figure 4:
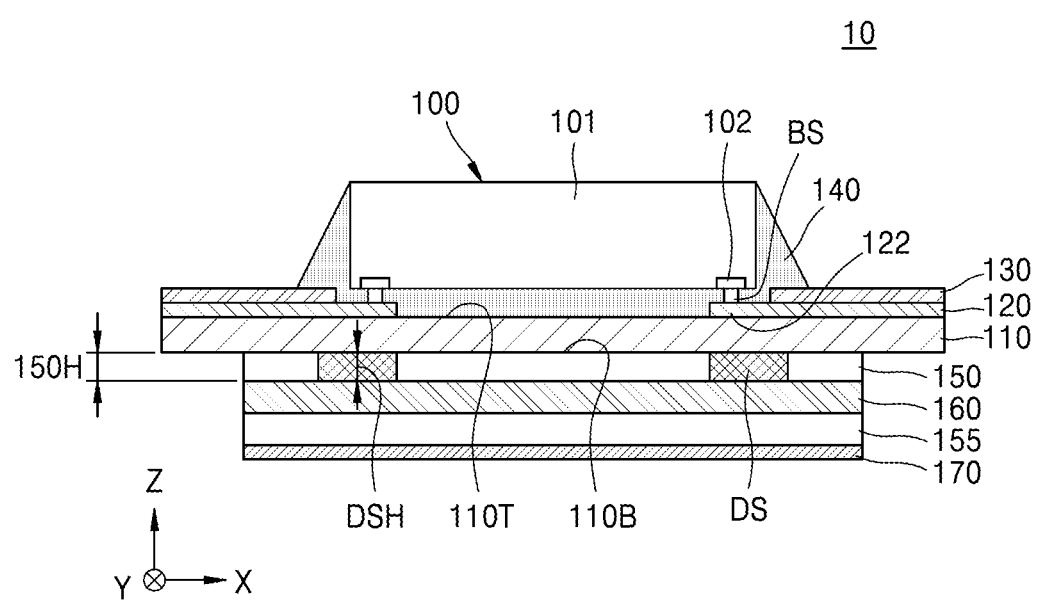
FIG. 4 is a lateral cross-sectional view of a circuit area of the CoF package of FIG. 2.
Figure 5:
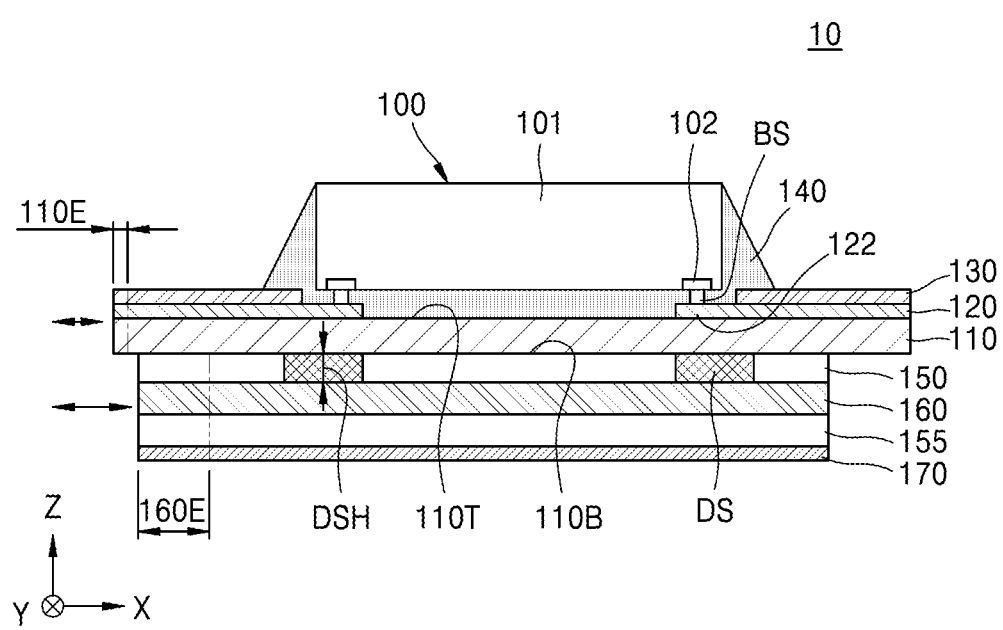
FIG. 5 is a lateral cross-sectional view showing a thermal expansion shape of the CoF package of FIG. 4.

FIG. 2 is a perspective view of the CoF package 10, FIG. 3 is a plan view of the CoF package 10 of FIG. 2, FIG. 4 is a lateral cross-sectional view of a circuit area of the CoF package 10 of FIG. 2, and FIG. 5 is a lateral cross-sectional view of a thermal expansion shape of the CoF package 10 of FIG. 4.

Referring to FIGS. 2 through 5 together, the CoF package 10 may include the semiconductor chip 100, a base film 110, a conductive line 120, a heat radiation member or heat radiator 160, and dam structures DS.

The semiconductor chip 100 may include a DDI to drive the display apparatus 1000 (see FIG. 1). In an implementation, the semiconductor chip 100 may correspond to a source DDI configured to generate an image signal by using a data signal transmitted from a timing controller and output the image signal through the display panel 500 (see FIG. 1). In an implementation, the semiconductor chip 100 may correspond to a gate DDI configured to output a scan signal including an on/off signal of a transistor through the display panel 500.

In an implementation, when the CoF package 10 is coupled to another electronic device, rather than the display apparatus 1000, the semiconductor chip 100 may correspond to a chip configured to drive the corresponding electronic device.

In an implementation, and for convenience of description, one semiconductor chip 100 is illustrated in the drawings. In an implementation, according to the characteristics of the display apparatus 1000, the number of source DDIs may be the same as or greater than the number of gate DDIs.

In an implementation, the semiconductor chip 100 may have a long side 100L extending lengthwise in a first direction (an X direction) and a short side 100S extending lengthwise in a second direction (a Y direction) perpendicular to the first direction (the X direction). In an implementation, the semiconductor chip 100 may have a rectangular shape. A length of the long side 100L may be greater than or equal to about 1.5 times a length of the short side 100S. The semiconductor chip 100 may have the shape described above in order to increase the degree of freedom of the arrangement and design of the conductive line 120 to be described below.

The semiconductor chip 100 may include a substrate 101 and a bump pad 102. The substrate 101 may include a semiconductor substrate and may have an active surface and a non-active surface facing each other. In an implementation, the substrate 101 may include a silicon wafer including crystalline silicon, poly-crystalline silicon, or amorphous silicon. In an implementation, the substrate 101 may include a semiconductor element, such as germanium (Ge), or a compound semiconductor, such as silicon carbide (SiC), gallium arsenide (GaAs), indium arsenide (InAs), indium phosphide (InP), or the like.

The substrate 101 may have a silicon on insulator (SOI) structure. In an implementation, the substrate 101 may include a conductive area, e.g., a well doped with impurities or a structure doped with impurities. In an implementation, the substrate 101 may have various device isolation structures, such as a shall trench isolation (STI) structure.

The semiconductor chip 100 may be arranged in or on a circuit area 111 of the base film 110, e.g., in or on a chip mounting area, and may be mounted on the base film 110 through a flip-chip bonding process. In an implementation, a bump structure BS, e.g., a solder ball, may be on the bump pad 102 exposed to or at the active surface of the semiconductor chip 100, and the bump structure BS may be physically and electrically coupled to a conductive pad 122 on the base film 110 so that the semiconductor chip 100 may be mounted on the base film 110. A portion of the bump pad 102 may function as an input terminal, and another portion of the bump pad 102 may function as an output terminal.

The bump structure BS may contact (e.g., directly contact) each of the bump pad 102 and the conductive pad 122 to be electrically connected to each of the bump pad 102 and the conductive pad 122. Through the bump structure BS, the semiconductor chip 100 may receive, from the outside, at least one of a control signal, a power signal, and a ground signal for an operation of the semiconductor chip 100, receive, from the outside, a data signal to be stored in the semiconductor chip 100, or may provide, to the outside, the data signal stored in the semiconductor chip 100. In an implementation, the bump structure BS may include or have a pillar structure, a ball structure, or a solder layer.

In an implementation, the base film 110 may include a flexible film including polyimide having an excellent coefficient of thermal expansion (CTE) and superior durability. In an implementation, the base film 110 may include synthetic resins, e.g., epoxy resins, acrylic resins, polyether nitrile resins, polyether sulfone resins, polyethylene terephthalate resins, or polyethylene naphthalate resins.

The base film 110 may include the circuit area 111 at a central portion thereof and a perforation (PF) area 112 at each of both lateral sides of the circuit area 111. The semiconductor chip 100 may be mounted in or on the circuit area 111.

The PF area 112 may be at each of both lateral sides of the base film 110 and may include a plurality of PF holes 114. Through the PF holes 114, reeling of the base film 110 onto a winding reel and releasing of the base film 110 from the winding reel may be controlled.

A pitch of the PF holes 114 may be constant, and thus, a length of the base film 110 may be determined according to the number of PF holes 114. A width and a length of the base film 110 may be determined according to the number and a size of the semiconductor chips 100 mounted on the base film 110 and an arrangement of the conductive line 120 formed on the base film 110.

The PF area 112 may be cut before the CoF package 10 is arranged in the display apparatus 1000. In an implementation, in the CoF package 10, only the circuit area 111 of the base film 110 may be arranged in the display apparatus 1000.

The conductive line 120 may be on an upper surface 110T of the base film 110. The conductive line 120 may include the conductive pad 122 at an end thereof. The conductive line 120 may include, e.g., aluminum (Al) foil or copper (Cu) foil. In an implementation, the conductive line 120 may be formed by patterning a metal layer formed on the base film 110, through a process, such as casting, laminating, or electro-plating.

The conductive pad 122 may correspond to a portion of the conductive line 120 or may correspond to a portion of the conductive line 120, the portion being coated with tin (Sn), gold (Au), nickel (Ni), or lead (Pb). In an implementation, the conductive pad 122 may be electrically connected to the conductive line 120 and may include a conductive material that is additionally formed. The conductive pad 122 may face the bump pad 102 of the semiconductor chip 100 and may be electrically connected to the bump pad 102.

A protection layer 130 may be on the upper surface 110T of the base film 110 to protect the conductive line 120 from external physical or chemical damage. The protection layer 130 may expose the conductive pad 122 of the conductive line 120 on the upper surface 110T of the base film 110 and may, at the same time, cover the (e.g., other parts of) conductive line 120. In an implementation, the protection layer 130 may include, e.g., a solder resist or a dry film resist. In an implementation, the protection layer 130 may include a silicon oxide insulating layer or a silicon nitride insulating layer.

An underfill 140 may be filled between the semiconductor chip 100 and the base film 110 to help protect the bump structure BS and components around the bump structure BS from external physical or chemical damage. In an implementation, the underfill 140 may be formed through a capillary underfill process. The underfill 140 may include, e.g., epoxy resins.

An adhesive layer 150 may be on the lower surface 110B of the base film 110. The adhesive layer 150 may be include an inorganic adhesive or a polymer adhesive. The polymer adhesive may include thermosetting resins or thermoplastic resins. The thermosetting resins may have a three-dimensional cross-link structure after a monomer is formed via heating, and the thermosetting resins may not become softened by reheating. The thermoplastic resins may correspond to resins having thermoplasticity via heating and may have a linear polymer structure. In an implementation, the adhesive layer 150 may have a tape shape.

The heat radiator 160 may be on a lower surface of the adhesive layer 150. The heat radiator 160 may be on the lower surface 110B of the base film 110 to correspond to, e.g., underlie or otherwise be aligned in the vertical Z direction with, the semiconductor chip 100 and may radiate heat emitted from the semiconductor chip 100. In an implementation, for efficient heat radiation characteristics, a length of the heat radiator 160 in the first direction (the X direction) may be greater than a length of the long side 100L of the semiconductor chip 100 in the first direction, and a length of the heat radiator 160 in the second direction (the Y direction) may be greater than a length of the short side 100S of the semiconductor chip 100 in the second direction.

The heat radiator 160 may include a heat radiation material. In an implementation, a CTE of a material included in the heat radiator 160 may be greater than a CTE of a material included in the base film 110. This aspect will be described in greater detail below.

In an implementation, the heat radiator 160 may have a tape shape including a metal. In an implementation, the metal may include, e.g., Al, Cu, W, or the like. In an implementation, the heat radiator 160 may include epoxy, acryl, silicon, or the like, and these resins may include a thermally conductive filler for excellent heat radiation effects. The thermally conductive filler may include $Al_2O_3$, BN, AlN, or diamond. In an implementation, the heat radiator 160 may include a curing material. In an implementation, the heat radiator 160 may include resins capable of heat curing, curing at room temperature, or ultraviolet (UV) curing.

A cover film 170 may be on a lower surface of the heat radiator 160 to help protect the heat radiator 160 from external physical or chemical damage. The cover film 170 may entirely cover the heat radiator 160. The cover film 170 may include, e.g., synthetic resins, such as epoxy-based resins, acryl, polyether nitrile, polyether sulfone, polyethylene terephthalate, polyethylene naphthalate, or the like. In an implementation, a cover adhesive layer 155 may be between the heat radiator 160 and the cover film 170. The cover adhesive layer 155 may include substantially the same material as the adhesive layer 150. In an implementation, the cover adhesive layer 155 may have the form of an adhesive tape.

The CoF package 10 according to an embodiment may include the plurality of dam structures DS in the adhesive layer 150 and overlapping (e.g., underlying or otherwise aligned with) the bump structure BS in the vertical direction (a Z direction). In an implementation, as illustrated in the drawings, the plurality of dam structures DS may include two dam structures DS.

The plurality of dam structures DS may be on the lower surface 110B of the base film 110 and may entirely overlap the short sides 100S of the semiconductor chip 100 in the third direction (the Z direction) perpendicular to both of the first direction (the X direction) and the second direction (the Y direction). In an implementation, from a planar perspective or in a plan view (e.g., along the Z direction), the semiconductor chip 100 may have a shape of a rectangle having the long sides 100L and the short sides 100S. In an implementation, a length DSL of the plurality of dam structures DS in the second direction (the Y direction) may be equal to or greater than a length of the short side 100S of the semiconductor chip 100.

When the plurality of dam structures DS are arranged as described above, the plurality of dam structures DS may overlap, in the third direction (the Z direction), all of the bump structures BS on or adjacent to the short sides 100S of the semiconductor chip 100. In an implementation, in plan view, each of the plurality of dam structures DS may be in an area in which the heat radiator 160 is arranged, as an island shape (e.g., may be contained within an area of the heat radiator 160). In an implementation, the plurality of dam structures DS may be arranged to be apart from each other.

Like the heat radiator 160, the plurality of dam structures DS may include a thermally conductive material. In an implementation, the plurality of dam structures DS may include an insulating material, and the heat radiator 160 may include a conductive material. The plurality of dam structures DS may include, e.g., an insulating material, such as polyimide, a semiconductor material, such as silicon, a conductive material, such as metal, or the like.

A thickness DSH (in the Z direction) of (each of) the plurality of dam structures DS may be substantially the same as a thickness 150H (in the Z direction) of the adhesive layer 150. In an implementation, the thickness DSH of the plurality of dam structures DS may be about 5 μm to about 50 μm.

In an implementation, upper surfaces (e.g., surfaces facing the semiconductor chip 100) of the plurality of dam structures DS may touch or contact (e.g., directly contact) and adhere to the lower surface 110B of the base film 110. In an implementation, lower surfaces (e.g., surfaces facing the heat radiator 160) of the plurality of dam structures DS may touch or contact (e.g., directly contact) the upper surface of the heat radiator 160 and may not adhere to the upper surface of the heat radiator 160. In an implementation, the upper surfaces of the plurality of dam structures DS may contact and may not adhere to the lower surface 110B of the base film 110, and the lower surfaces of the plurality of dam structures DS may contact and adhere to the upper surface of the heat radiator 160. In an implementation, the adhesive layer 150 may not be in or on either one of the upper surface and the lower surface of the plurality of dam structures DS. In an implementation, at least one surface of the dam structures DS may slide freely along the surface of the base film 110 or the heat radiator 160.

In an implementation, a CTE of a material included in the plurality of dam structures DS may be greater than a CTE of a material included in the base film 110 and less than a CTE of a material included in the heat radiator 160.

Miniaturization of a bezel and a reduced thickness of a panel may be desirable in a display apparatus, and a temperature of the semiconductor chip 100, which is mounted on the CoF package 10, may be controlled. Thus, through the heat radiator 160, heat generated from the semiconductor chip 100 may be efficiently discharged to the outside of the CoF package 10.

In the case of the CoF package 10 having such a structure, materials included in the base film 110 and the heat radiator 160 may be different from each other, and CTEs of the materials may be different from each other. If a radical temperature change were to occur during an operation of the CoF package 10, the base film 110 and the heat radiator 160 could radically contract or expand.

If the CTE of the heat radiator 160 were to be greater than the CTE of the base film 110, a change width 160E of the heat radiator 160 could be relatively greater than a change width 110E of the base film 110 according to a temperature change. Stress concentration due to this change could accumulate in or at the bump structure BS, which is a connection structure between the semiconductor chip 100 and the base film 110, and thus, defects, such as cracks, could occur in the bump structure BS.

Furthermore, the semiconductor chip 100 may have a rectangular shape having the long side 100L and the short side 100S, and the stress concentration due to the change of the base film 110 and the heat radiator 160 could more greatly affect the bump structures BS on the short side 100S of the semiconductor chip 100.

In the CoF package 10 according to an embodiment, the plurality of dam structures DS may be between the base film 110 and the heat radiator 160 to help decrease thermal fatigue. In an implementation, the plurality of dam structures DS may overlap (e.g., be aligned with) the bump structure BS on the short side 100S of the semiconductor chip 100 in the third direction (the Z direction), e.g., the bump structure BS may be a region where stress may be most concentrated. Adhesion between the base film 110 and the heat radiator 160 may be decreased at the short side 100S of the semiconductor chip 100, and the stress concentration may be alleviated at the short side 100S of the semiconductor chip 100.

In an implementation, to function as a buffer for the stress concentration due to the difference between the change width 160E of the heat radiator 160 and the change width 110E of the base film 110, the plurality of dam structures DS may be arranged at the short side 100S of the semiconductor chip 100.

In an implementation, the plurality of dam structures DS may include a material having a greater thermal conductivity than a material included in the adhesive layer 150. Thus, heat generated from the semiconductor chip 100 may be even more efficiently discharged to the outside of the CoF package 10, in addition to the heat discharging effect of the heat radiator 160.

Consequently, the CoF package 10 according to an embodiment may help improve heat radiation characteristics and thermal fatigue characteristics through the plurality of dam structures DS between the base film 110 and the heat radiator 160, and thus, the reliability of the CoF package 10 and the display apparatus 1000 including the CoF package 10 may be improved.

Figure 6:
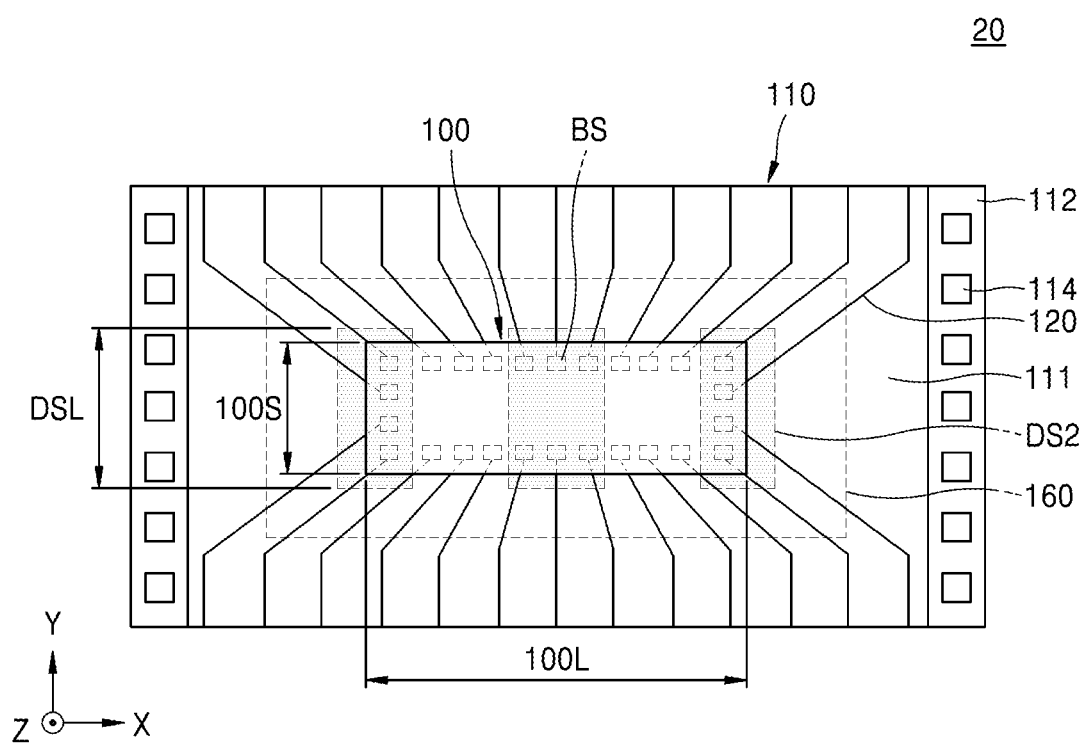
FIGS. 6 through 8 are plan views of CoF packages according to other embodiments.
Figure 7:
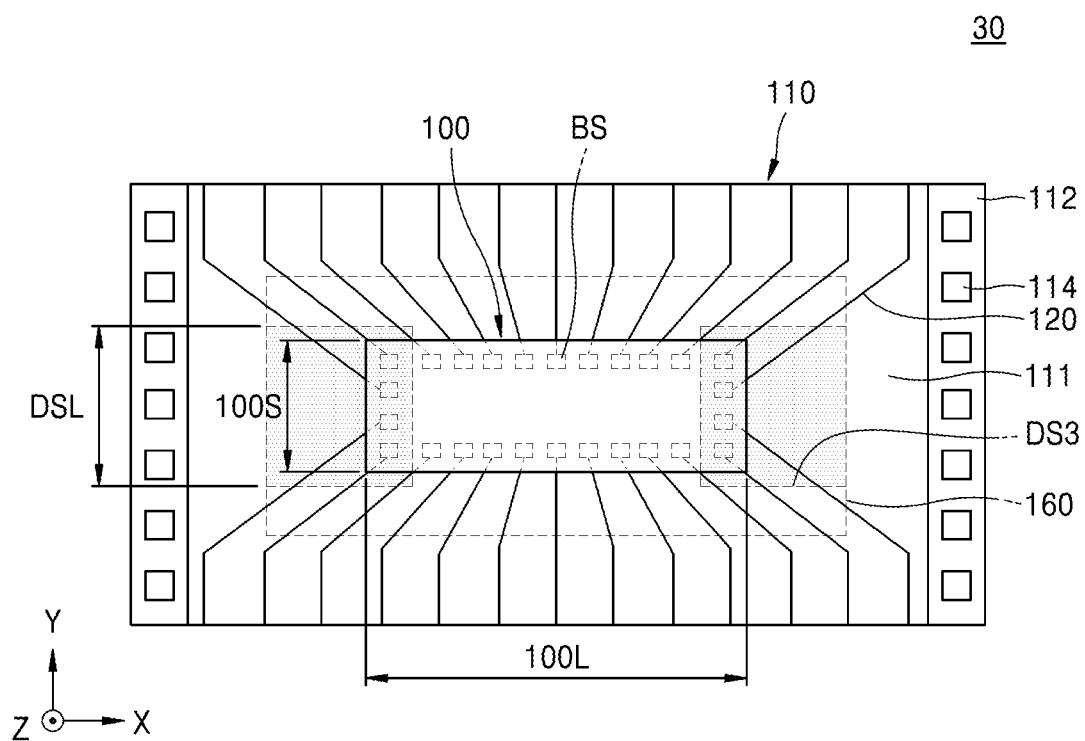
Figure 8:
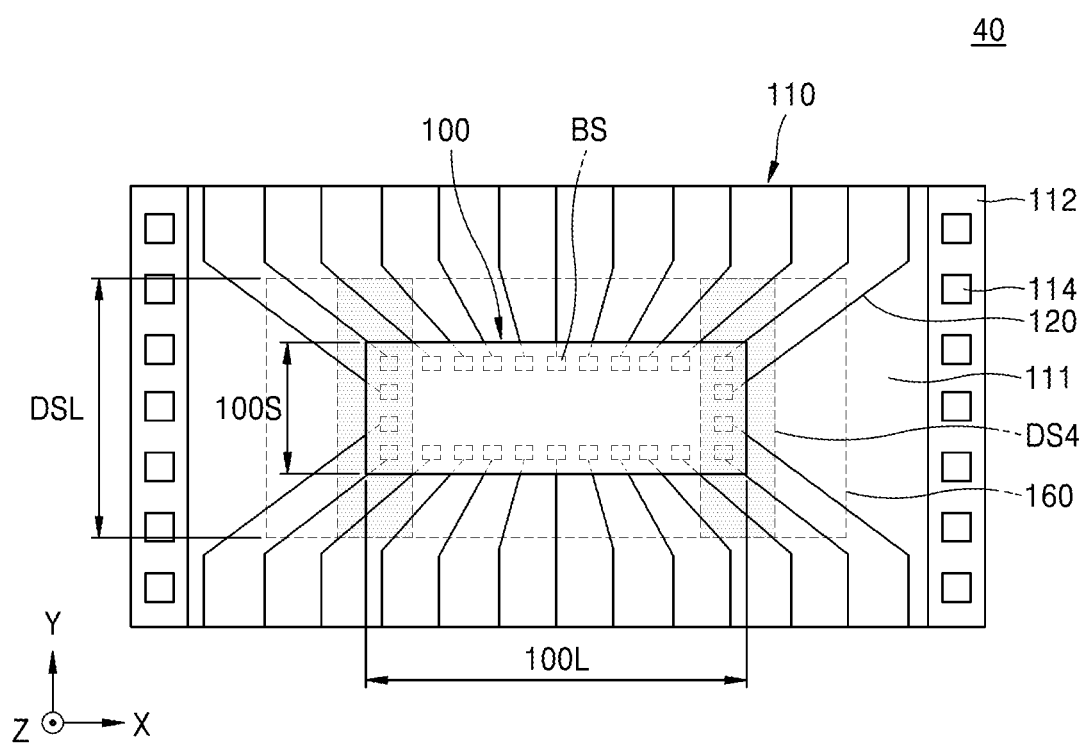

FIGS. 6 through 8 are plan views of CoF packages 20, 30, and 40 according to other embodiments.

Most of components included in the CoF packages 20, 30, and 40 to be described hereinafter and materials of the components may be substantially the same or similar to the descriptions given above with reference to FIGS. 2 through 5. Thus, for convenience of description, different aspects from the aspects of the CoF package 10 described above may be mainly described.

Referring to FIG. 6, the CoF package 20 may include the semiconductor chip 100, the base film 110, the conductive line 120, the heat radiator 160, and dam structures DS2.

The CoF package 20 according to an embodiment may include three dam structures DS2 overlapping the bump structures BS of the semiconductor chip 100 in a third direction (a Z direction).

Two of the three dam structures DS2 may be on a lower surface of the base film 110 to entirely overlap the short sides 100S of the semiconductor chip 100 in the third direction (the Z direction). The remaining one of the three dam structures DS2 may be on the lower surface of the base film 110 to partially overlap the long sides 100L of the semiconductor chip 100 in the third direction (the Z direction), e.g., at a central portion of the semiconductor chip 100.

A length DSL of the three dam structures DS2 in a second direction (a Y direction) may be equal to or greater than a length of the short sides 100S of the semiconductor chip 100 in the second direction.

The three dam structures DS2 may be arranged as described above, the three dam structures DS2 may overlap, in the third direction (the Z direction), all of the bump structures BS arranged on the short sides 100S of the semiconductor chip 100, and may overlap, in the third direction (the Z direction), one or more of the bump structures BS arranged on the long sides 100L of the semiconductor chip 100.

In an implementation, in plan view, each of the three dam structures DS2 may be arranged in an area in which the heat radiator 160 is arranged, as an island shape (e.g., within an area defined by the heat radiator 160). In an implementation, the three dam structures DS2 may be arranged to be apart from each other (e.g., in the X direction).

In an implementation, a thickness (e.g., in the Z direction) of the three dam structures DS2 may be about 5 μm to about 50 μm. In an implementation, an upper surface of the three dam structures DS2 may contact (e.g., directly contact) and adhere to the lower surface of the base film 110, and a lower surface of the three dam structures DS2 may contact (e.g., directly contact) and may not adhere to an upper surface of the heat radiator 160. In an implementation, the upper surface of the three dam structures DS2 may contact and may not adhere to the lower surface of the base film 110, and the lower surface of the three dam structures DS2 may contact and adhere to the upper surface of the heat radiator 160. In an implementation, at least one surface of the dam structures DS2 may slide freely along the surface of the base film 110 or the heat radiator 160.

Referring to FIG. 7, the CoF package 30 may include the semiconductor chip 100, the base film 110, the conductive line 120, the heat radiator 160, and dam structures DS3.

The CoF package 30 according to an embodiment may include two dam structures DS3 overlapping some of the bump structures BS of the semiconductor chip 100 in a third direction (a Z direction).

The two dam structures DS3 may be on a lower surface of the base film 110 to entirely overlap the short sides 100S of the semiconductor chip 100 in the third direction (the Z direction). As described above, in plan view, the semiconductor chip 100 may have a rectangular shape having the long side 100L extending lengthwise in a first direction (an X direction) and the short side 100S extending lengthwise in a second direction (a Y direction).

Thus, a length DSL of the two dam structures DS3 in the second direction (the Y direction) may be equal to or greater than the length of the short side 100S of the semiconductor chip 100 in the second direction. In an implementation, at least one side of the two dam structures DS3 may overlap or be aligned with (e.g., coplanar with), in the third direction (the Z direction), a short side of the heat radiator 160 (extending along the second direction (the Y direction)).

In an implementation, in plan view, at least one side of each of the two dam structures DS3 may be aligned with an edge of the heat radiator 160. In an implementation, at least one side surface of each of the two dam structures DS3 may be exposed to the adhesive layer 150 (see FIG. 4).

When the two dam structures DS3 are arranged as described above, the two dam structures DS3 may overlap, in the third direction (the Z direction), all of the bump structures BS on or adjacent to the short sides 100S of the semiconductor chip 100.

In an implementation, a thickness (in the Z direction) of the two dam structures DS3 may be about 5 μm to about 50 μm. In an implementation, an upper surface of the two dam structures DS3 may contact and adhere to the lower surface of the base film 110, and a lower surface of the two dam structures DS3 may contact and may not adhere to an upper surface of the heat radiator 160. In an implementation, the upper surface of the two dam structures DS3 may contact and may not adhere to the lower surface of the base film 110, and the lower surface of the two dam structures DS3 may contact and adhere to the upper surface of the heat radiator 160.

Referring to FIG. 8, the CoF package 40 may include the semiconductor chip 100, the base film 110, the conductive line 120, the heat radiator 160, and dam structures DS4.

The CoF package 40 according to an embodiment may include two dam structures DS4 overlapping some of the bump structures BS of the semiconductor chip 100 in a third direction (a Z direction).

The two dam structures DS4 may be on a lower surface of the base film 110 to entirely overlap the short sides 100S of the semiconductor chip 100 in the third direction (the Z direction). In an implementation, in plan view, the semiconductor chip 100 may have a rectangular shape having the long side 100L extending lengthwise in a first direction (an X direction) and the short side 100S extending lengthwise in a second direction (a Y direction).

In an implementation, a length DSL of the two dam structures DS4 in the second direction (the Y direction) may be equal to or greater than a length of the short side 100S of the semiconductor chip 100. In an implementation, at least one side of the two dam structures DS4 may overlap or be aligned with, in the third direction (the Z direction), a long side of the heat radiator 160 (extending in the first direction (the X direction)).

In an implementation, in plan view, at least one side of each of the two dam structures DS4 may be aligned (e.g., coplanar) with an edge of the heat radiator 160. In an implementation, at least one side surface of each of the two dam structures DS4 may be exposed to the adhesive layer 150 (see FIG. 4).

When the two dam structures DS4 are arranged as described above, the two dam structures DS4 may overlap, in the third direction (the Z direction), all of the bump structures BS arranged on or adjacent to the short sides 100S of the semiconductor chip 100.

In an implementation, a thickness (in the Z direction) of the two dam structures DS4 may be about 5 μm to about 50 μm. In an implementation, an upper surface of the two dam structures DS4 may contact and adhere to the lower surface of the base film 110, and a lower surface of the two dam structures DS4 may contact and may not adhere to an upper surface of the heat radiator 160. In an implementation, the upper surface of the two dam structures DS4 may contact and may not adhere to the lower surface of the base film 110, and the lower surface of the two dam structures DS4 may contact and adhere to the upper surface of the heat radiator 160.

Figure 9:
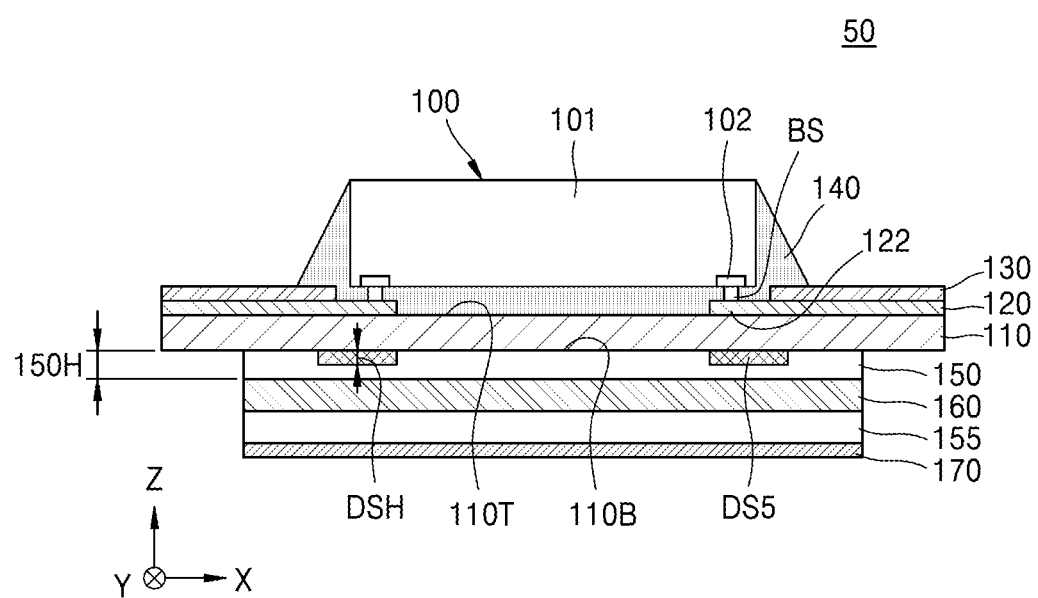
FIGS. 9 and 10 are lateral cross-sectional views of CoF packages according to other embodiments.
Figure 10:
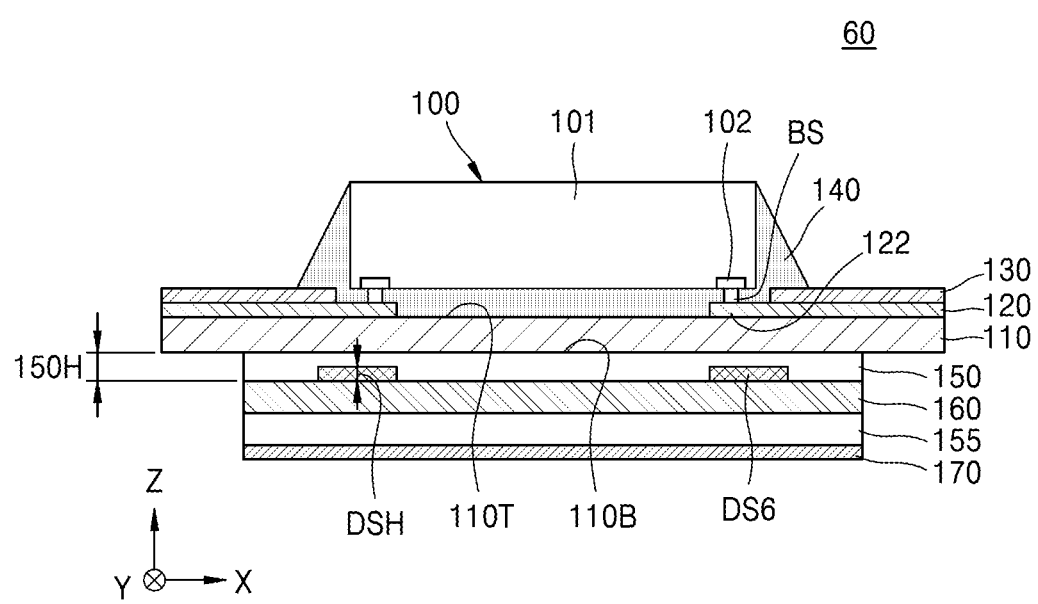

FIGS. 9 and 10 are lateral cross-sectional views of CoF packages 50 and 60 according to other embodiments.

Most of components included in the CoF packages 50 and 60 to be described hereinafter and materials of the components may be substantially the same or similar to the descriptions given above with reference to FIGS. 2 through 5. Thus, for convenience of description, different aspects from the aspects of the CoF package 10 described above may be mainly described.

Referring to FIG. 9, the CoF package 50 may include the semiconductor chip 100, the base film 110, the conductive line 120, the heat radiator 160, and dam structures DS5.

The CoF package 50 according to an embodiment may include the plurality of dam structures DS5 in the adhesive layer 150 and overlapping some of the bump structures BS in a third direction (a Z direction). In an implementation, as illustrated in FIG. 9, the plurality of dam structures DS5 may include two dam structures.

The plurality of dam structures DS5 may be on the lower surface 110B of the base film 110 to entirely overlap (e.g., underlie or otherwise cover or be aligned with) the short sides 100S (see FIG. 3) of the semiconductor chip 100 in the third direction (the Z direction).

When the plurality of dam structures DS5 are arranged as described above, the plurality of dam structures DS5 may overlap, in the third direction (the Z direction), all of the bump structures BS arranged on or adjacent to the short sides 100S of the semiconductor chip 100.

An upper surface of the plurality of dam structures DS5 may contact and may not adhere to the lower surface 110B of the base film 110, and a lower surface of the plurality of dam structures DS5 may not contact an upper surface of the heat radiator 160. In an implementation, the adhesive layer 150 may not be on the upper surface of the plurality of dam structures DS5 (e.g., and may be between the plurality of dam structures DS5 and the heat radiator 160).

In an implementation, a thickness DSH (in the Z direction) of the plurality of dam structures DS5 may be less than a thickness 150H (in the Z direction) of the adhesive layer 150. In an implementation, the thickness DSH of the plurality of dam structures DS5 may be about a half of the thickness 150H of the adhesive layer 150.

Referring to FIG. 10, the CoF package 60 may include the semiconductor chip 100, the base film 110, the conductive line 120, the heat radiator 160, and dam structures DS6.

The CoF package 60 according to an embodiment may include the plurality of dam structures DS6 in the adhesive layer 150 and overlapping some of the bump structures BS in a third direction (a Z direction). In an implementation, as illustrated in FIG. 10, the plurality of dam structures DS6 include two dam structures.

The plurality of dam structures DS6 may be on the lower surface 110B of the base film 110 to entirely overlap the short sides 100S (see FIG. 3) of the semiconductor chip 100 in the third direction (the Z direction).

When the plurality of dam structures DS6 are arranged as described above, the plurality of dam structures DS6 may overlap, in the third direction (the Z direction), all of the bump structures BS arranged on or adjacent to the short sides 100S of the semiconductor chip 100.

In an implementation, an upper surface of the plurality of dam structures DS6 may not contact the lower surface 110B of the base film 110, and a lower surface of the plurality of dam structures D6 may contact and may not adhere to an upper surface of the heat radiator 160. In an implementation, the adhesive layer 150 may not be on the lower surface of the plurality of dam structures DS6. In an implementation, the adhesive layer 150 may be between the plurality of dam structures DS6 and the base film 110 (e.g., in the Z direction).

the plurality of dam structures DS6, a thickness DSH (in the Z direction) of the plurality of dam structures DS6 may be less than the thickness 150H (in the Z direction) of the adhesive layer 150. the plurality of dam structures DS6, the thickness DSH of the plurality of dam structures DS6 may be about a half of the thickness 150H of the adhesive layer 150.

Figure 11:
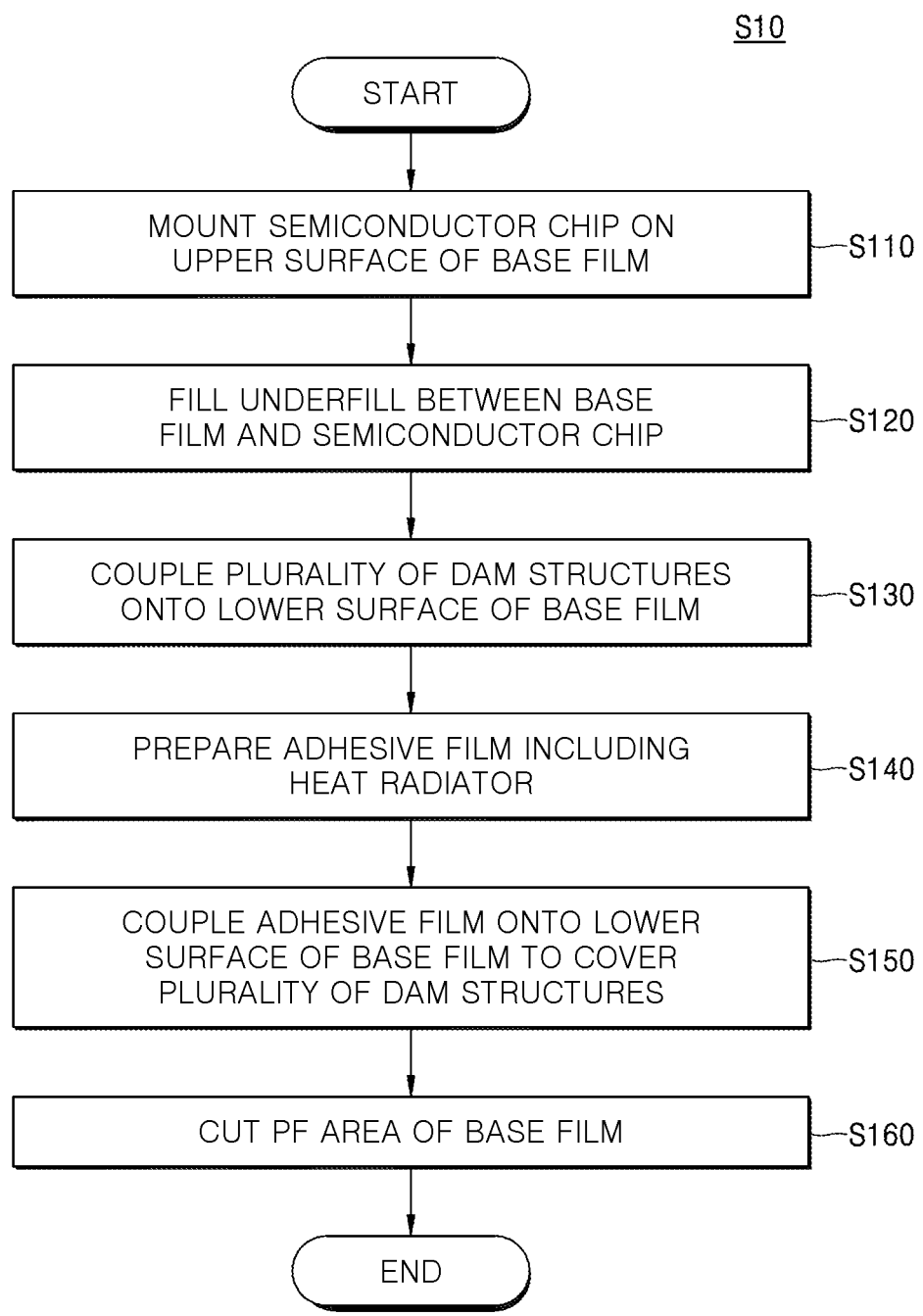
FIG. 11 is a flowchart of a method of manufacturing a CoF package according to an embodiment.
Figure 12:
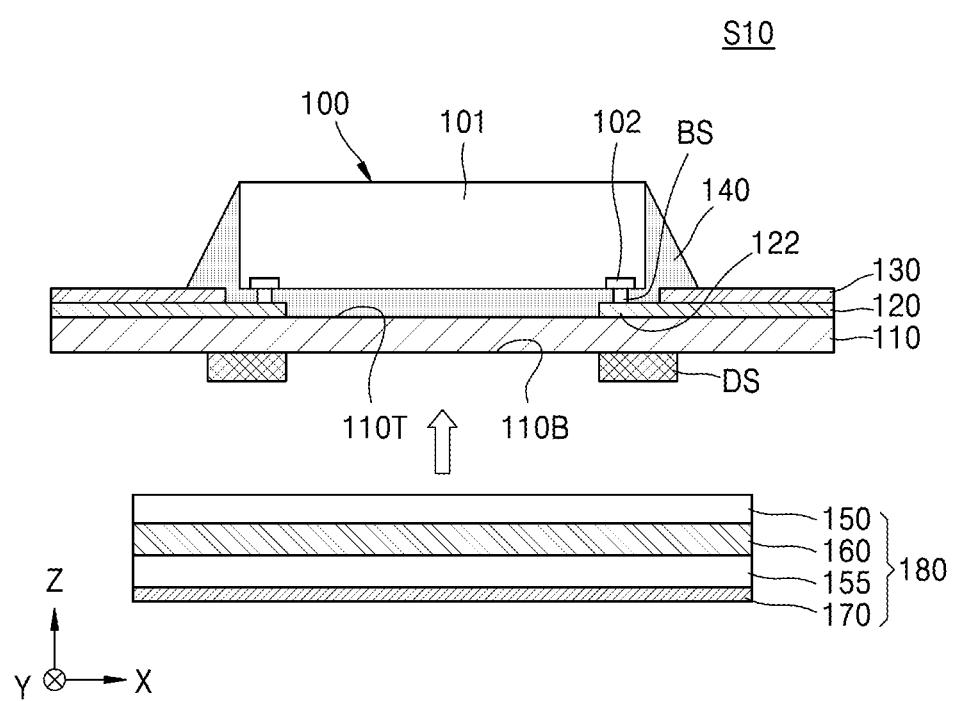
FIG. 12 is a view of a stage in a method of manufacturing a CoF package, according to an embodiment.

FIGS. 11 and 12 are a flowchart and a view of a stage in a method S10 of manufacturing a CoF package, according to an embodiment.

Referring to FIG. 11, the method S10 of manufacturing the CoF package may include first through sixth operations (S110 through S160).

When a certain embodiment may be differently realized, a specific order of operations may be different from the described orders. For example, two processes sequentially described may be substantially and simultaneously performed or may be performed in orders opposite to the described orders.

The method S10 of manufacturing the CoF package according to an embodiment may include a first operation (S110) of mounting a semiconductor chip on an upper surface of a base film, a second operation (S120) of filling an underfill between the base film and the semiconductor chip, a third operation (S130) of coupling a plurality of dam structures on a lower surface of the base film, a fourth operation (S140) of preparing an adhesive film including a heat radiator, a fifth operation (S150) of coupling the adhesive film onto the lower surface of the base film so as to cover the plurality of dam structures, and a sixth operation (S160) of cutting a PF area of the base film.

Referring to FIG. 12, the method (S10) of manufacturing the CoF package may include coupling the dam structures DS onto the lower surface 110B of the base film 110 and coupling an adhesive film 180 onto the lower surface 110B of the base film 110 so as to cover the plurality of dam structures DS.

First, the plurality of dam structures DS may be coupled onto the lower surface 110B of the base film 110 to entirely overlap short sides of the semiconductor chip 100 in a third direction (a Z direction).

Thereafter, the general adhesive film 180 including the heat radiator 160 may be coupled onto the lower surface 110B of the base film 110 so as to cover the plurality of dam structures DS, so that the plurality of dam structures DS may be arranged in the adhesive layer 150 and may overlap the bump structure BS in a vertical direction (the Z direction).

In an implementation, according to the method (S10) of manufacturing the CoF package, the general adhesive film 180, which is previously used, may be used.

Other operations in addition to this operation may be understood based on the descriptions above.

Figure 13:
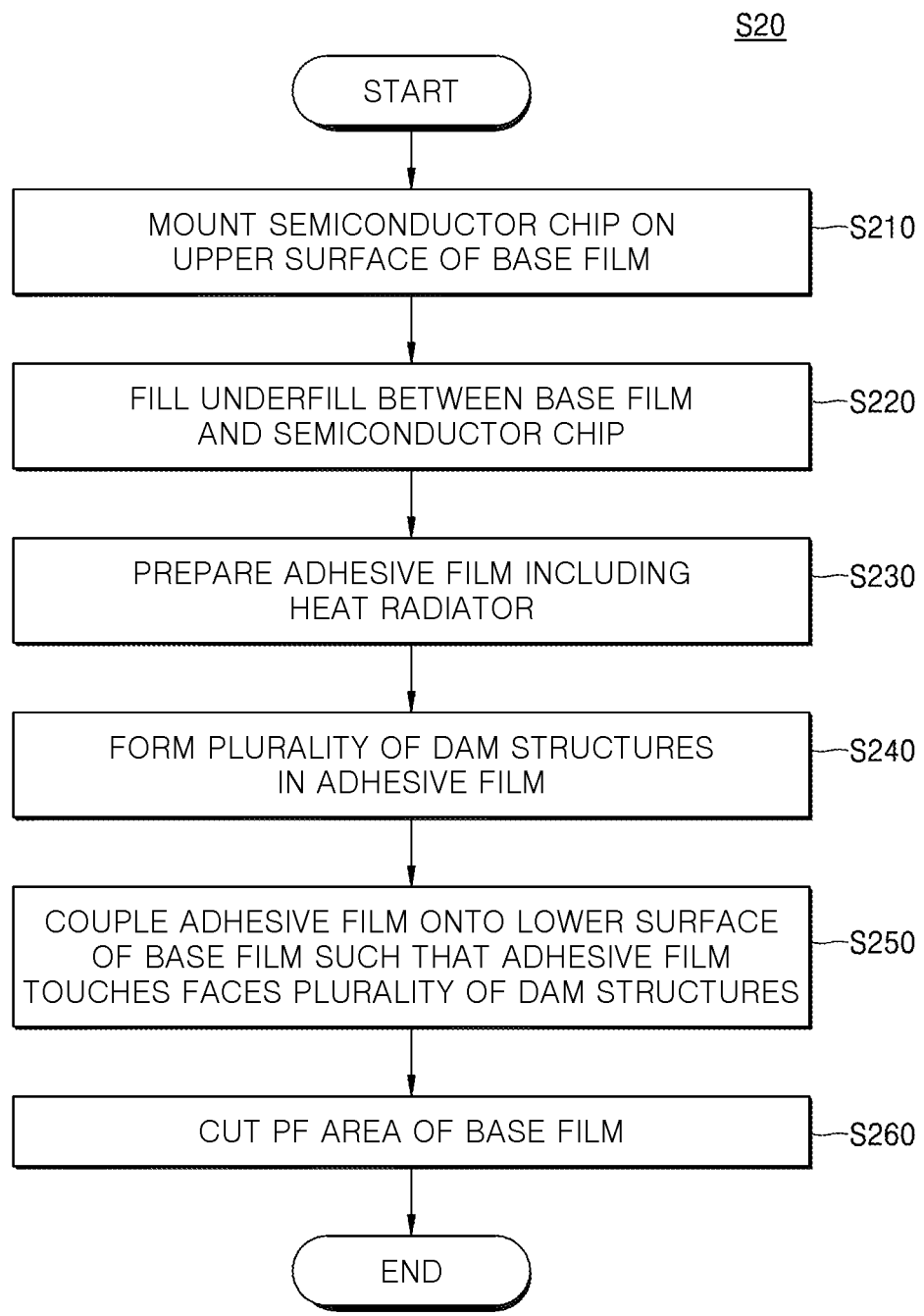
FIG. 13 is a flowchart of a method of manufacturing a CoF package according to other embodiments.
Figure 14:
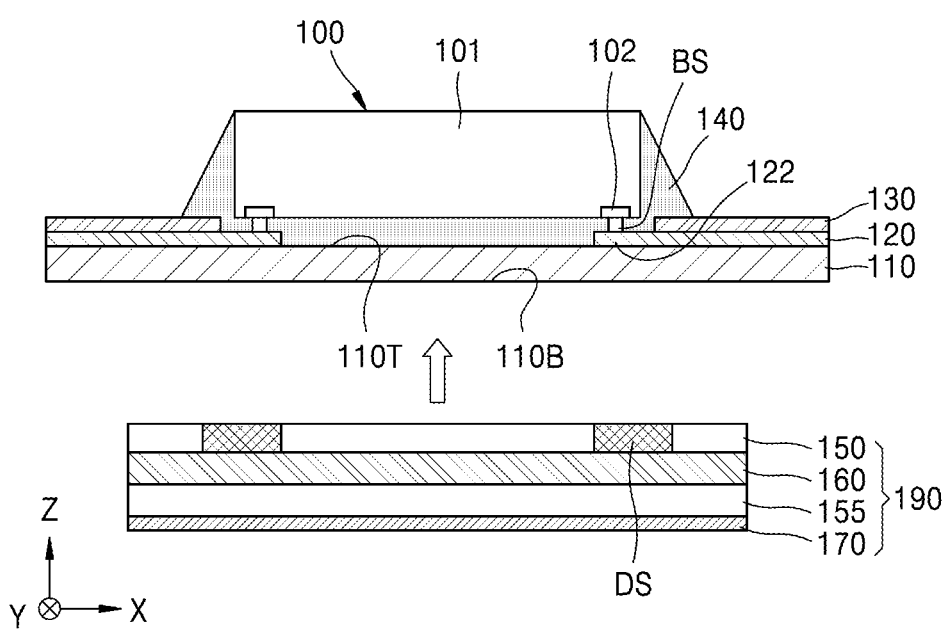
FIG. 14 is a view of a stage in a method of manufacturing of manufacturing a CoF package, according to other embodiments.

FIGS. 13 and 14 are a flowchart and a view of a stage in a method S20 of manufacturing a CoF package, according to other embodiments.

Referring to FIG. 13, the method S20 of manufacturing the CoF package may include first through sixth process orders (S210 through S260).

When a certain embodiment may be differently realized, specific process orders may be different from the described orders. For example, two operations sequentially described may be substantially and simultaneously performed or may be performed in orders opposite to the described orders.

The method S20 of manufacturing the CoF package according to an embodiment may include a first operation (S210) of mounting a semiconductor chip on an upper surface of a base film, a second operation (S220) of filling an underfill between the base film and the semiconductor chip, a third operation (S230) of preparing an adhesive film including a heat radiator, a fourth operation (S240) of forming a plurality of dam structures in the adhesive film, a fifth operation (S250) of coupling the adhesive film onto a lower surface of the base film such that the adhesive film touches the plurality of dam structures, and a sixth operation (S260) of cutting a PF area of the base film.

Referring to FIG. 14, the method (S20) of manufacturing the CoF package may include forming the plurality of dam structures DS in an adhesive film 190 and coupling the adhesive film 190 onto the lower surface 110B of the base film 110 to contact (e.g., directly contact) the plurality of dam structures DS.

First, the plurality of dam structures DS may be formed in the adhesive layer 150 of the adhesive film 190 to entirely overlap short sides of the semiconductor chip 100 in a third direction (a Z direction).

Thereafter, the adhesive film 190 including the plurality of dam structures DS may be coupled onto the lower surface 110B of the base film 110, and thus, the plurality of dam structures DS may overlap the bump structure BS in a vertical direction (the Z direction).

In an implementation, according to the method S20 of manufacturing the CoF package, first, the plurality of dam structures DS may be included in the adhesive film 190, and then, the previous order of manufacturing operations may be performed.

Other operations in addition to this operation may be understood based on the descriptions herein.

Figure 15:
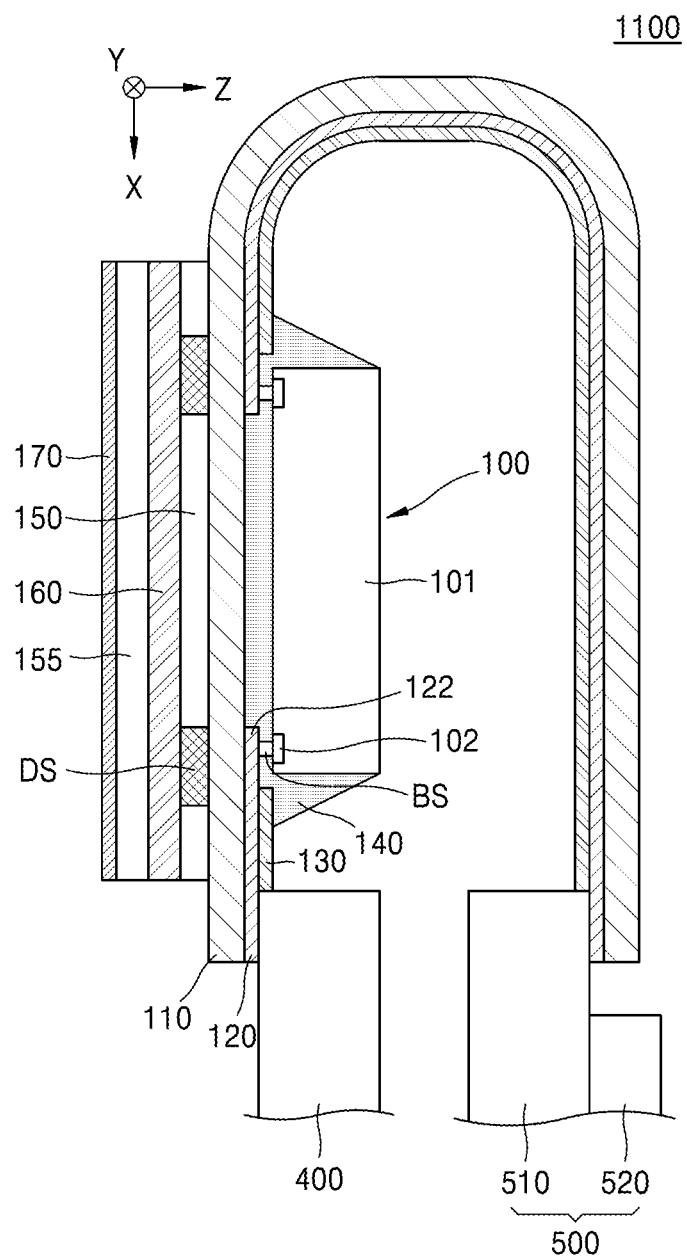
FIG. 15 is a lateral cross-sectional view of a display apparatus according to an embodiment.

FIG. 15 is a lateral cross-sectional view of a display apparatus 1100 according to an embodiment.

FIG. 15 illustrates the display apparatus 1100 including the CoF package 10, the driving printed circuit board 400, and the display panel 500.

In the display apparatus 1100 according to an embodiment, the display panel 500 may include the transparent substrate 510 and the image area 520 on the transparent substrate 510. In an implementation, as illustrated in FIG. 15, the CoF package 10 may have a shape that a portion of the CoF package 10 described above with reference to FIGS. 2 through 5 is bent.

An end of the CoF package 10 and a portion of the display panel 500 may face each other, and the other end of the CoF package 10 and a portion of the driving printed circuit board 400 may face each other. The CoF package 10 may receive a signal that is output from the driving printed circuit board 400 through the conductive line 120 and transmit the signal to the display panel 500 through the conductive line 120.

One or more driving circuit chips 410 (see FIG. 1), which may simultaneously or sequentially apply power and signals to the CoF package 10 through the conductive line 120, may be mounted on the driving printed circuit board 400.

The display panel 500 may include the transparent substrate 510 and the image area 520 including a plurality of pixels. The transparent substrate 510 may have a front surface and a rear surface facing each other, and the image area 520 may be arranged on the front surface of the transparent substrate 510. The CoF package 10 may be bent toward the front surface of the transparent substrate 510 and fixed, and the driving printed circuit board 400 may be arranged to face the rear surface of the transparent substrate 510.

In an implementation, the CoF package 10 may be bent toward the front surface of the display panel 500 and fixed, and the driving printed circuit board 400 may be arranged to face the rear surface of the display panel 500.

By way of summation and review, as miniaturization of a bezel and a reduced thickness of a panel are trends in a display apparatus, methods of controlling a temperature of a semiconductor chip, which is mounted in a CoF package, may be considered.

One or more embodiments may provide a CoF package in which a heat radiator is arranged and a display apparatus including the CoF package.

One or more embodiments may provide a chip-on-film (CoF) package, in which heat radiation characteristics and thermal fatigue characteristics are improved.

One or more embodiments may provide a display apparatus including a CoF package, in which heat radiation characteristics and thermal fatigue characteristics are improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A chip-on-film (CoF) package, comprising:
    a base film having an upper surface and a lower surface facing each other;
    a conductive line on the upper surface of the base film;
    a semiconductor chip on the upper surface of the base film and connected to the conductive line through a bump structure;
    a heat radiator on the lower surface of the base film and underlying the semiconductor chip;
    an adhesive layer between the lower surface of the base film and the heat radiator; and
    a plurality of dam structures in the adhesive layer and overlapping the bump structure,
    wherein, in plan view, the plurality of dam structures are discontinuously arranged in an island shape.

2. The CoF package as claimed in claim 1, wherein:
    in a plan view, the semiconductor chip has long sides extending in a first direction and short sides extending in a second direction perpendicular to the first direction, and
    the plurality of dam structures are arranged to entirely overlap the short sides of the semiconductor chip.

3. The CoF package as claimed in claim 2, wherein, in plan view, a length of the plurality of dam structures in the second direction is equal to or greater than a length of the short sides of the semiconductor chip in the second direction.

4. The CoF package as claimed in claim 3, wherein, in plan view, the plurality of dam structures entirely overlap a portion of the bump structure arranged along the short sides of the semiconductor chip.

5. The CoF package as claimed in claim 2, wherein, in plan view:
a length of the heat radiator in the first direction is greater than a length of the long sides of the semiconductor chip in the first direction, and
a length of the heat radiator in the second direction is greater than a length of the short sides of the semiconductor chip in the second direction.

6. The CoF package as claimed in claim 1, wherein, in plan view, the plurality of dam structures are within an area defined by edges of the heat radiator.

7. The CoF package as claimed in claim 6, wherein, in plan view, at least one side of the plurality of dam structures is aligned with an edge of the heat radiator.

8. The CoF package as claimed in claim 1, wherein the base film includes a flexible insulating substrate.

9. The CoF package as claimed in claim 1, wherein each dam structure of the plurality of dam structures and the heat radiator includes a conductive material.

10. The CoF package as claimed in claim 1, wherein:
each dam structure of the plurality of dam structures includes an insulating material, and
the heat radiator includes a conductive material.

11. A chip-on-film (CoF) package, comprising:
a base film having an upper surface and a lower surface facing each other, the base film including a chip mounting area on the upper surface thereof;
a conductive line on the upper surface of the base film and having a conductive pad at an end thereof;
a semiconductor chip on the chip mounting area and having long sides extending in a first direction and short sides extending in a second direction perpendicular to the first direction;
a protection layer on the conductive line and the upper surface of the base film to expose the conductive pad;
a bump structure between the conductive pad and a bump pad of the semiconductor chip;
an underfill filled the semiconductor chip and the base film and surrounding the bump structure;
a heat radiator on the lower surface of the base film and underlying the chip mounting area;
an adhesive layer between the lower surface of the base film and the heat radiator;
two dam structures in the adhesive layer and respectively underlying the short sides of the semiconductor chip; and
a cover film coupled onto a lower surface of the heat radiator.

12. The CoF package as claimed in claim 11, wherein:
a thickness of each of the dam structures is substantially the same as a thickness of the adhesive layer, and
the dam structures contact both the base film and the heat radiator.

13. The CoF package as claimed in claim 12, wherein the adhesive layer is not arranged on either one of upper surfaces and lower surfaces of the dam structures.

14. The CoF package as claimed in claim 11, wherein:
the heat radiator includes a metal tape, and
the dam structures each include a metal material.

15. The CoF package as claimed in claim 14, wherein:
a coefficient of thermal expansion of the metal tape is greater than a coefficient of thermal expansion of each of the dam structures, and
the coefficient of thermal expansion of each of the dam structures is greater than a coefficient of thermal expansion of the base film.

16. A display apparatus, comprising:
a chip-on-film (CoF) package including a base film having an upper surface and a lower surface facing each other;
a display panel arranged to face a portion of the upper surface of the base film; and
a driving printed circuit board arranged to face the other portion of the upper surface of the base film,
wherein the CoF package includes:
a conductive line on the upper surface of the base film;
a semiconductor chip on the upper surface of the base film and connected to the conductive line through a bump structure;
a heat radiator on the lower surface of the base film and underlying the semiconductor chip; and
a plurality of dam structures between the lower surface of the base film and the heat radiator and overlapping the bump structure.

17. The display apparatus as claimed in claim 16, wherein the base film includes a flexible film.

18. The display apparatus as claimed in claim 17, wherein:
the display panel has a front surface including a plurality of pixels and a rear surface facing the front surface,
the CoF package is bent toward the front surface of the display panel and fixed, and
the driving printed circuit board is arranged to face the rear surface of the display panel.

19. The display apparatus as claimed in claim 16, wherein, in a plan view:
the semiconductor chip has long sides extending in a first direction and short sides extending in a second direction perpendicular to the first direction, and
the plurality of dam structures are arranged to entirely overlap the short sides of the semiconductor chip.

20. The display apparatus as claimed in claim 19, wherein, in plan view:
a length of each of the plurality of dam structures in the second direction is equal to or greater than a length of the short sides of the semiconductor chip in the second direction, and
the plurality of dam structures entirely overlap the bump structure arranged along the short sides of the semiconductor chip.

* * * * *